(12) United States Patent
Beyer et al.

(10) Patent No.: US 8,791,509 B2
(45) Date of Patent: Jul. 29, 2014

(54) MULTIPLE GATE TRANSISTOR HAVING HOMOGENOUSLY SILICIDED FIN END PORTIONS

(75) Inventors: Sven Beyer, Dresden (DE); Patrick Press, Dresden (DE); Rainer Giedigkeit, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 469 days.

(21) Appl. No.: 12/620,083

(22) Filed: Nov. 17, 2009

(65) Prior Publication Data

US 2010/0133614 A1    Jun. 3, 2010

(30) Foreign Application Priority Data

Nov. 28, 2008  (DE) .......................... 10 2008 059 500

(51) Int. Cl.
*H01L 29/786*  (2006.01)
*H01L 29/78*   (2006.01)
*H01L 29/772*  (2006.01)

(52) U.S. Cl.
CPC ................................... *H01L 29/785* (2013.01)
USPC .... 257/288; 257/401; 257/776; 257/E21.619; 257/E29.119; 257/E21.577; 438/197; 438/279; 438/639

(58) Field of Classification Search
CPC .................. H01L 29/41791; H01L 29/66795; H01L 29/785–29/7854
USPC ......... 438/598, 618, 626, 629, 630, 631, 639, 438/645, 649, 651, 655, 664, 682, 697, 721, 438/756; 257/401, 413, E21.619, E21.634
See application file for complete search history.

(56) References Cited

U.S. PATENT DOCUMENTS

| | | | |
|---|---|---|---|
| 6,018,195 A * | 1/2000 | Takebuchi ...................... | 257/752 |
| 6,413,802 B1 | 7/2002 | Hu et al. ........................ | 438/151 |
| 6,541,327 B1 * | 4/2003 | Chan et al. ...................... | 438/229 |
| 6,544,850 B1 * | 4/2003 | Schnabel et al. .............. | 438/286 |
| 6,780,691 B2 * | 8/2004 | Cha et al. ...................... | 438/161 |
| 7,396,710 B2 * | 7/2008 | Okuno .......................... | 438/149 |
| 7,419,898 B2 * | 9/2008 | Liaw ............................. | 438/618 |
| 8,435,845 B2 * | 5/2013 | Ning et al. ..................... | 438/186 |
| 2003/0008450 A1 * | 1/2003 | Tsai et al. ..................... | 438/200 |
| 2004/0061172 A1 | 4/2004 | Furukawa et al. ............ | 257/347 |
| 2004/0217408 A1 | 11/2004 | Hofmann et al. ............. | 257/308 |
| 2005/0051825 A1 | 3/2005 | Fujiwara et al. ............. | 257/308 |
| 2005/0263795 A1 * | 12/2005 | Choi et al. ..................... | 257/213 |

(Continued)

OTHER PUBLICATIONS

PCT Search Report and Written Opinion from PCT/US2009/006276 dated Feb. 17, 2010.

(Continued)

*Primary Examiner* — Laura Menz
*Assistant Examiner* — Maliheh Malek
(74) *Attorney, Agent, or Firm* — Amerson Law Firm, PLLC

(57) ABSTRACT

In a multiple gate transistor, the plurality of Fins of the drain or source of the transistor are electrically connected to each other by means of a common contact element, wherein enhanced uniformity of the corresponding contact regions may be accomplished by an enhanced silicidation process sequence. For this purpose, the Fins may be embedded into a dielectric material in which an appropriate contact opening may be formed to expose end faces of the Fins, which may then act as silicidation surface areas.

20 Claims, 12 Drawing Sheets

(56) References Cited

U.S. PATENT DOCUMENTS

| | | | |
|---|---|---|---|
| 2006/0006466 A1 | 1/2006 | Iinuma | 257/347 |
| 2006/0084232 A1 | 4/2006 | Grupp et al. | 438/291 |
| 2006/0157749 A1* | 7/2006 | Okuno | 257/288 |
| 2006/0175669 A1* | 8/2006 | Kim et al. | 257/401 |
| 2006/0202266 A1* | 9/2006 | Radosavljevic et al. | 257/344 |
| 2006/0220131 A1 | 10/2006 | Kinoshita et al. | 257/347 |
| 2007/0099414 A1* | 5/2007 | Frohberg et al. | 438/618 |
| 2007/0161170 A1* | 7/2007 | Orlowski et al. | 438/197 |
| 2007/0176222 A1* | 8/2007 | Ikemasu et al. | 257/308 |
| 2007/0184627 A1 | 8/2007 | Cho et al. | 438/399 |
| 2008/0277725 A1* | 11/2008 | Shino | 257/347 |
| 2009/0020764 A1* | 1/2009 | Anderson et al. | 257/77 |
| 2009/0096002 A1* | 4/2009 | Yu et al. | 257/308 |
| 2010/0038679 A1* | 2/2010 | Chan et al. | 257/190 |

OTHER PUBLICATIONS

Translation of Official Communication from German Patent Office for German Patent Application No. 10 2008 059 500.4-33 dated Jul. 21, 2009.

* cited by examiner

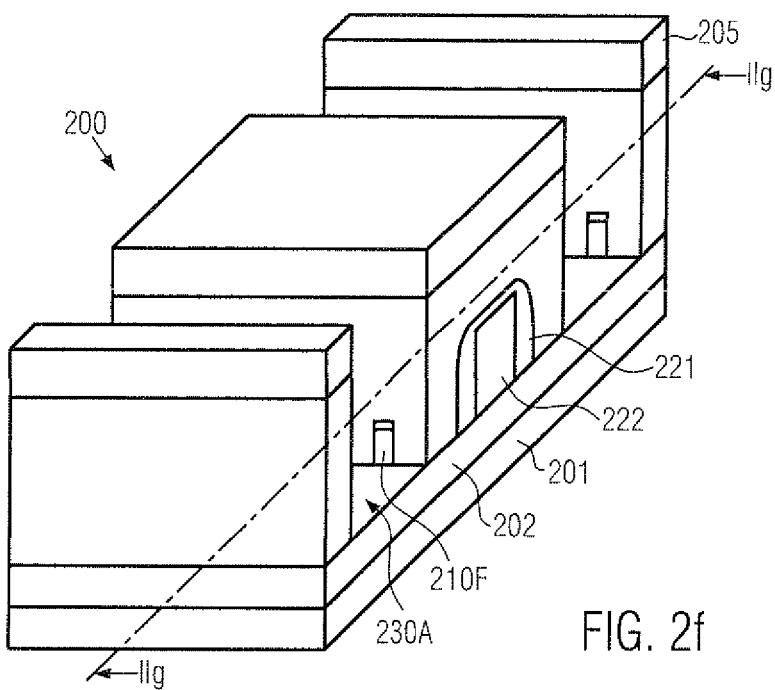
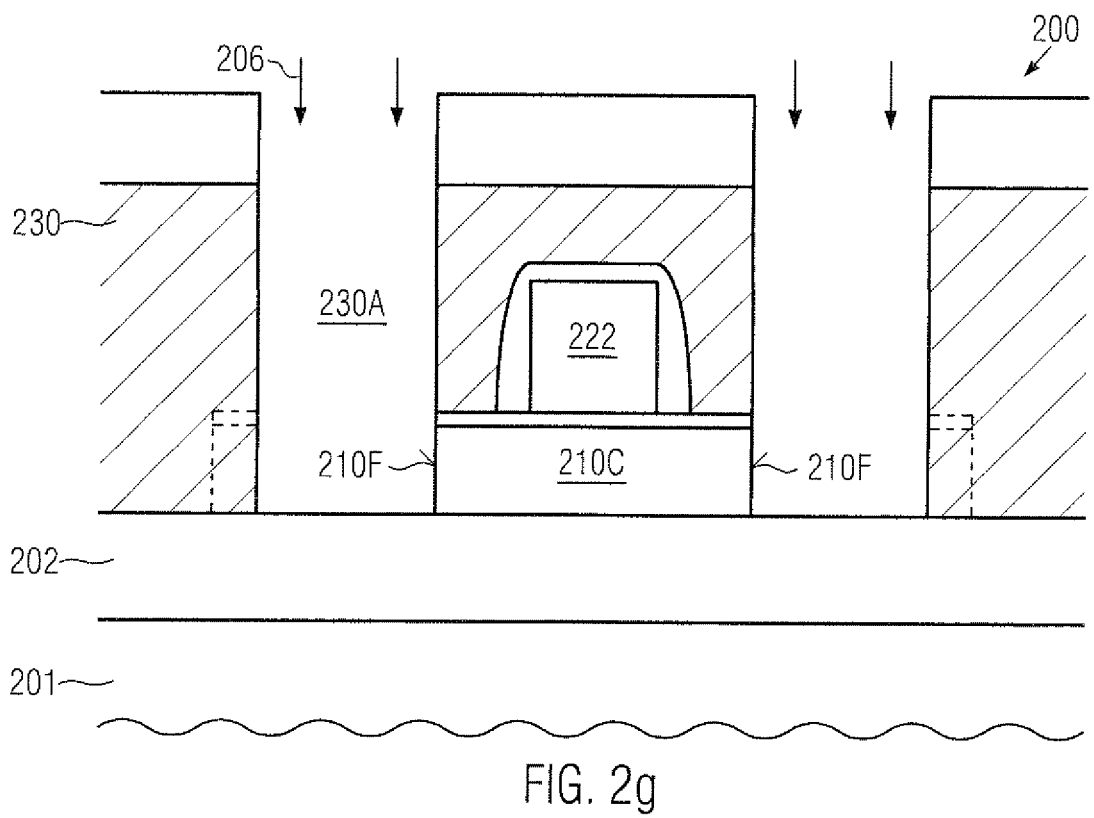

MULTIPLE GATE TRANSISTOR HAVING HOMOGENOUSLY SILICIDED FIN END PORTIONS

BACKGROUND OF THE INVENTION

1. Field of the Invention

Generally, the present disclosure relates to the fabrication of highly sophisticated integrated circuits including transistor elements having a double gate (FinFET) or triple gate architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are based on silicon due to substantially unlimited availability, the well-understood characteristics of silicon and related materials and processes and the experience gathered during the past 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a basic gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance-driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides capacitive coupling that would be obtained by an extremely thin silicon dioxide layer. It has, therefore, been suggested to replace silicon dioxide with high permittivity materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$) and the like.

Although significant advantages may be obtained with respect to performance and controllability of sophisticated planar transistor architectures on the basis of the above-specified strategies, in view of further device scaling, new transistor configurations have been proposed in which a "three-dimensional" architecture may be provided in an attempt to obtain a desired channel width while at the same time maintaining good controllability of the current flow through the channel region. To this end, so-called FinFETS have been proposed in which a thin sliver or fin of silicon may be formed in a thin active layer of a silicon-on-insulator (SOI) substrate, wherein, on both sidewalls, a gate dielectric material and a gate electrode material may be provided, thereby realizing a double gate transistor, the channel region of which may be fully depleted. Typically, in sophisticated applications, the width of the silicon fins is on the order of 10 nm and the height thereof is on the order of 30 nm. In a modified version of the basic double gate transistor architecture, a gate dielectric material and a gate electrode may also be formed on a top surface of the fin, thereby realizing a tri-gate transistor architecture. With reference to FIGS. 1a-1b, the basic configuration of conventional FinFETS and characteristics associated with the conventional manufacturing techniques may be described in more detail.

FIG. 1a schematically illustrates a perspective view of a semiconductor device 100 which represents a conventional double gate or FinFET field effect transistor (FinFET) including a plurality of individual transistor cells 150. As illustrated, the device 100 comprises a substrate 101, such as a silicon substrate, having formed thereon a buried insulating layer, for instance in the form of a silicon dioxide material. Moreover, each of the transistor cells 150 comprises a Fin 110, which may represent a remaining portion of a silicon layer (not shown) initially formed on the buried oxide layer 102, thereby defining an SOI configuration. The Fin 110 comprises a portion 111 corresponding to drain and source regions and also a channel region (not shown) which is covered by a gate electrode structure 120, which may enclose a central portion of each of the Fins 110. That is, the gate electrode structure 120 may be formed on respective sidewalls 110A, 110B of the central part of each of the Fins 110 and may comprise an appropriate gate dielectric material, such as silicon dioxide, in combination with an electrode material, such as polycrystalline silicon. A top surface of the Fins 110 may be covered by a cap layer 112, which may be comprised of silicon nitride, silicon dioxide and the like. It should be appreciated that the cap layer 112 may also represent a gate dielectric material if, in addition to the sidewall surfaces 110A, 110B, the top surface of the Fins is also to be used as a channel region. The Fins 110 may have a height 110H, a width 110W and a length, i.e., an effective channel length that is substantially defined by the width of the gate electrode structure 120.

Typically, the semiconductor device 100 comprising the plurality of transistor cells 150 is formed by patterning the active silicon layer formed on the buried insulating layer 102 and performing appropriately designed manufacturing processes for providing the gate electrode structure 120. For example, the cap layer 112 may be formed in the active silicon layer, which may subsequently be patterned on the basis of sophisticated lithography and etch techniques in order to obtain the Fins 110. Thereafter, an appropriate gate dielectric material, such as silicon dioxide and the like, may be formed, for instance by oxidation and the like, followed by the deposition of an appropriate gate electrode material, such as polysilicon and the like. Next, the gate electrode structure 120 may be obtained by patterning the gate electrode material, for instance using well-established highly selective etch techniques, which are also well established for the manufacturing of polysilicon gate electrodes in planar transistor configurations. Thereafter, appropriate dopant profiles may be established for the drain and source regions 111, possibly in combination with appropriate spacer structures (not shown), which may be accomplished by corresponding ion implantation techniques.

FIG. 1b schematically illustrates a top view of the device 100 in a further advanced manufacturing stage. As illustrated, the drain regions of the individual transistor cells 150 and the corresponding source regions may be connected by an epitaxially re-grown silicon material, thereby forming a silicon layer 103 at the drain side and the source side, respectively. Typically, the silicon material at the drain side and the source side may be formed by selective epitaxial growth techniques, thereby requiring corresponding spacer elements 104 in order to provide a required offset of the material 103 with respect to the gate electrode material of the gate electrode structure 120. Depending on the overall process strategy, the spacer structures 104 may also be used for defining corresponding heavily doped drain and source areas after forming corresponding drain and source extension regions (not shown) with a reduced dopant concentration in order to appropriately connect to the corresponding channel regions formed on sidewalls of the central portions of the Fins 110. After forming the semiconductor material 103, thereby providing separate drain and source regions of the device 100, corresponding contact areas (not shown), for instance comprised of a metal silicide, may be formed in the semiconductor material 103 on the basis of well-established metal silicide process regimes. Thereafter, an appropriate contact structure may be formed by embedding the device 100 in an appropriate dielectric material and forming corresponding contact elements so as to connect to the drain and source regions 103 and the gate electrode structure 120 in accordance with the overall circuit configuration.

During operation, appropriate voltages may be applied to the device 100 in order to establish a current flow from drain to source when applying an appropriate control voltage to the gate electrode structure 120. Thus, a conductive channel may be created at the sidewalls of the Fins 110 that are covered by the gate electrode structure 120 wherein, depending on the overall device dimensions, a fully depleted semiconductor area may be gained within the Fin 110. It should be appreciated that, depending on the characteristics of the cap layer 112, the top surface of the Fins 110 covered by the gate electrode structure 120 may also act as a channel region, thereby providing an even further increased effective transistor width, while also enabling an increased height of the Fins 110 while still maintaining a substantially fully depleted state. Although the multiple gate transistor device 100 as illustrated in FIGS. 1a and 1b may be advantageous with respect to providing an increased drive current capability while still maintaining high controllability of the current flow between the drain and source areas 103, it turns out that a high degree of variability of device characteristics may occur, which is assumed to be caused, among other things, by the configuration of the common drain and source regions 103. For example, performing a silicidation procedure on the basis of the semiconductor layers 103, which have been epitaxially formed in an earlier manufacturing stage, may result in a certain degree of non-uniformity of the corresponding metal silicide regions with respect to the adjacent channel regions, which may thus contribute to a significant variability of the resulting overall drive current.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to multiple gate transistors, such as double gate transistors and tri-gate transistors, and corresponding manufacturing techniques, in which device variability may be reduced by providing an enhanced contact regime so as to electrically connect one or more Fins of the transistor element directly with a contact element while avoiding corresponding selective epitaxial growth techniques and a non-uniform silicidation process of the epitaxially grown semiconductor material. For this purpose, according to one illustrative aspect disclosed herein, the end face of one or more Fins may be appropriately exposed so as to be available for forming a contact region therein, for instance on the basis of a silicidation process, thereby producing a substantially homogeneous contact region, which may thus enhance the uniformity of current flow from a contact element into the corresponding drain and source portions of the Fins, wherein at the same time a plurality of Fins may commonly be connected to the contact element. In other illustrative aspects disclosed herein, appropriate surface areas of end portions of the Fins may be exposed during an etch process for forming a contact opening that directly connects to each of respective end portions of the Fins. Also, in this case, a more efficient and uniform conductive path may be established from the common contact element to the individual drain and source areas of the Fins, thereby also enhancing overall operational stability of the multiple gate transistor elements.

One illustrative method disclosed herein comprises forming a dielectric material above end portions of a plurality of Fins of a multiple gate transistor and forming an opening in the dielectric material so as to extend through the end portions. The method further comprises forming a contact region in a cross-sectional area of each of the end portions that is exposed in the opening. Finally, the method comprises forming a contact element in the opening, wherein the contact element connects to each of the contact regions.

A further illustrative method disclosed herein relates to forming a contact element connecting to a multiple gate transistor. The method comprises forming a dielectric material so as to enclose an end portion of one or more Fins of the multiple gate transistor. Furthermore, the method comprises forming a contact opening in the dielectric material, wherein the contact opening exposes at least a portion of the one or more Fins. Finally, the method comprises filling the contact opening with a metal-containing material so as to provide a contact element that connects to the at least a portion of the one or more Fins.

One illustrative semiconductor device disclosed herein comprises a plurality of Fins of a multiple gate transistor and a gate electrode structure formed above a central part of the plurality of Fins. Furthermore, a dielectric material encloses an end portion of each of the plurality of Fins and a metal-containing contact element is formed in the dielectric material and has an interface with at least one surface area of each end portion of the plurality of Fins.

BRIEF DESCRIPTION OF THE DRAWINGS

The disclosure may be understood by reference to the following description taken in conjunction with the accompanying drawings, in which like reference numerals identify like elements, and in which:

FIGS. 2f-2g schematically illustrate a perspective view and a cross-sectional view, respectively, in a manufacturing stage in which a contact opening is formed in a dielectric material, according to illustrative embodiments;

Figure 1A:
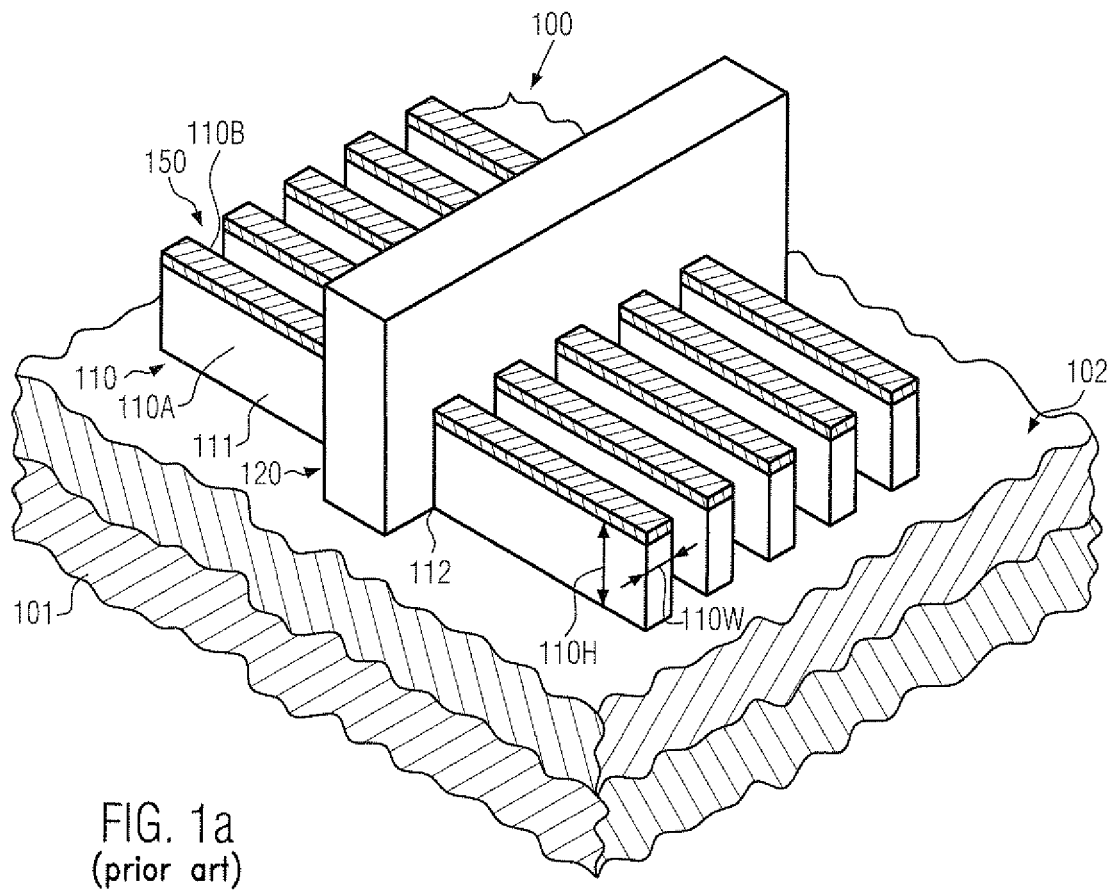
FIGS. 1a-1b schematically illustrate a perspective view and a top view, respectively, of a conventional multiple gate transistor element during various manufacturing stages in providing an epitaxially grown common drain and source area for electrically connecting the plurality of Fin end portions and for connecting to a contact element, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and multiple gate transistors in which the contact resistance of drain and source terminals with respect to the individual drain and source portions and the channel regions connected thereto may be enhanced in order to reduce overall product variability. For this purpose, in some illustrative embodiments, a contact region may be formed in each individual end portion of the corresponding Fins of the multiple gate transistor such that an enhanced degree of homogeneity with respect to the contact resistance in the various channel regions may be accomplished. To this end, in one illustrative embodiment, a metal silicide may be formed in and on a corresponding end face of each of the Fins, thereby providing substantially identical silicidation conditions with respect to the various channel regions. This may be accomplished in some illustrative embodiments by embedding the individual Fins in a dielectric material and forming a corresponding opening therein so as to "cut" through the Fins, thereby exposing the respective end faces of the Fins within the opening. Consequently, a very homogenous silicidation process may be performed within the exposed cross-sectional area or end face of each of the Fins, which may result in enhanced uniformity of the contact resistance across the entire "channel width" of each channel region in the corresponding Fins. In some illustrative embodiments, the corresponding opening may also be used as a contact opening, which may subsequently be filled with an appropriate contact metal, thereby connecting each of the contact regions of the individual Fins with the contact element, so that a low resistance electrical connection between all end portions of the Fins may be established.

In still other illustrative embodiments, at least the sidewall surfaces of the end portions of the Fins may be exposed within a contact opening, which may subsequently be filled with an appropriate metal-containing material, thereby establishing a homogeneous electrical connection to each of the corresponding channel regions while also electrically shorting the corresponding end portions of the Fins to establish a common drain terminal and/or source terminal. Consequently, well-established silicidation techniques, deposition processes of inlaid techniques and the like may be used, while nevertheless providing significantly enhanced product stability due to a reduction of corresponding transistor variabilities, which may typically be caused by conventional contact regimes using epitaxial growth techniques prior to the silicidation procedure.

Figure 1B:
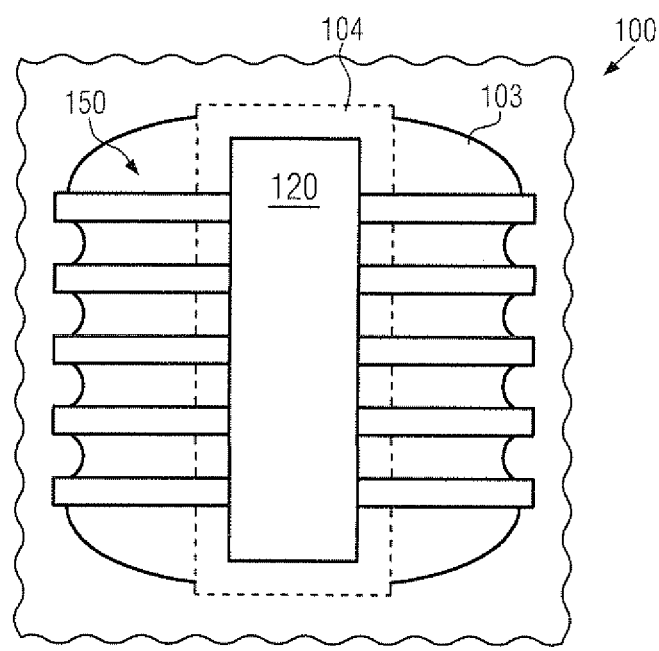
Figure 2A:
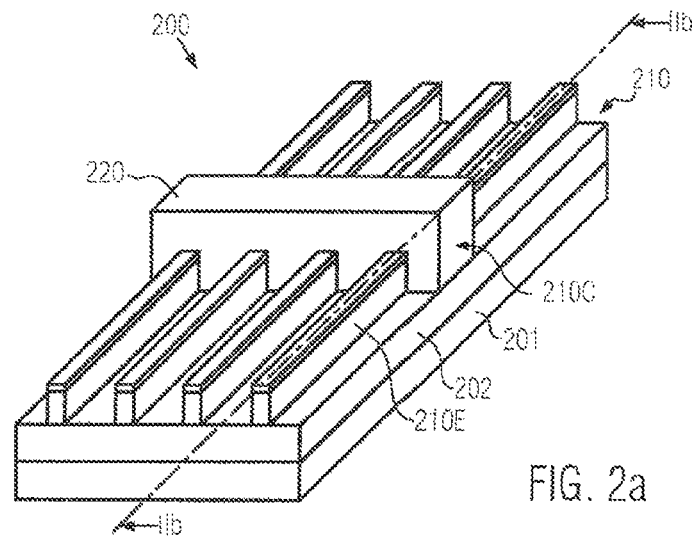
FIGS. 2a-2b schematically illustrate a perspective view and a cross-sectional view, respectively, of a multiple gate transistor in an initial manufacturing stage, according to illustrative embodiments.
Figure 2B:
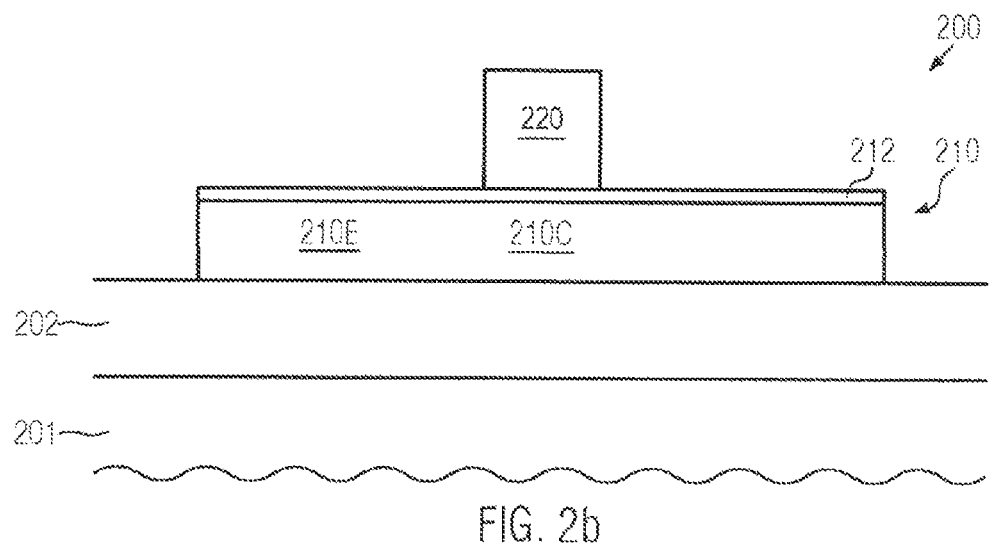
Figure 2C:
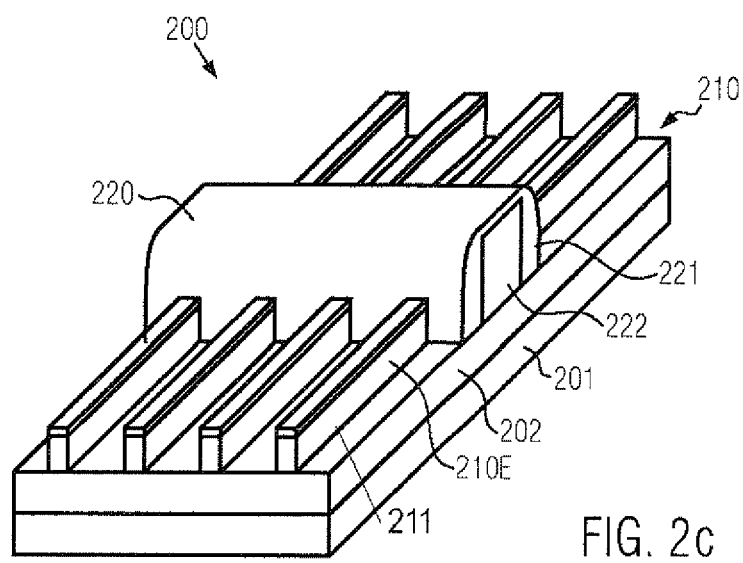
FIGS. 2c-2d schematically illustrate perspective views of the multiple gate transistor in a further advanced manufacturing stage, according to further illustrative embodiments.
Figure 2D:
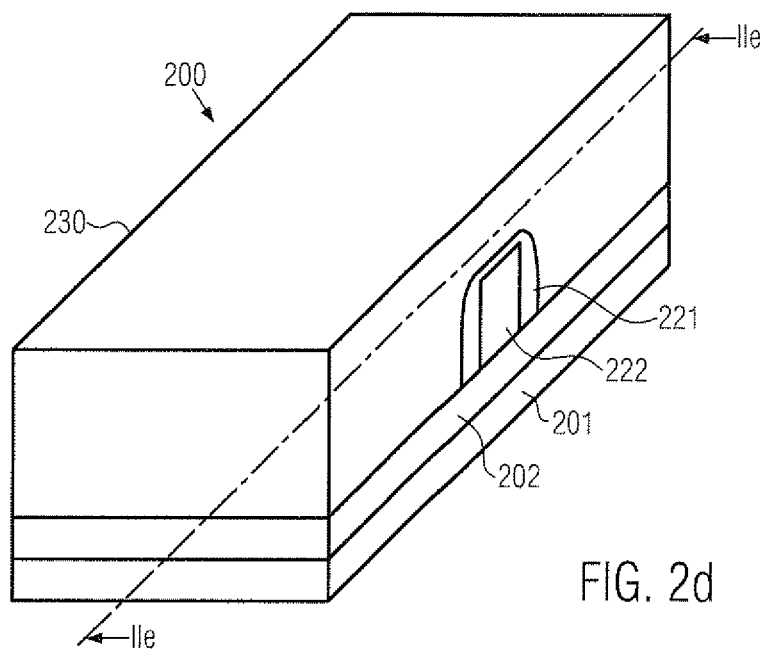
Figure 2E:
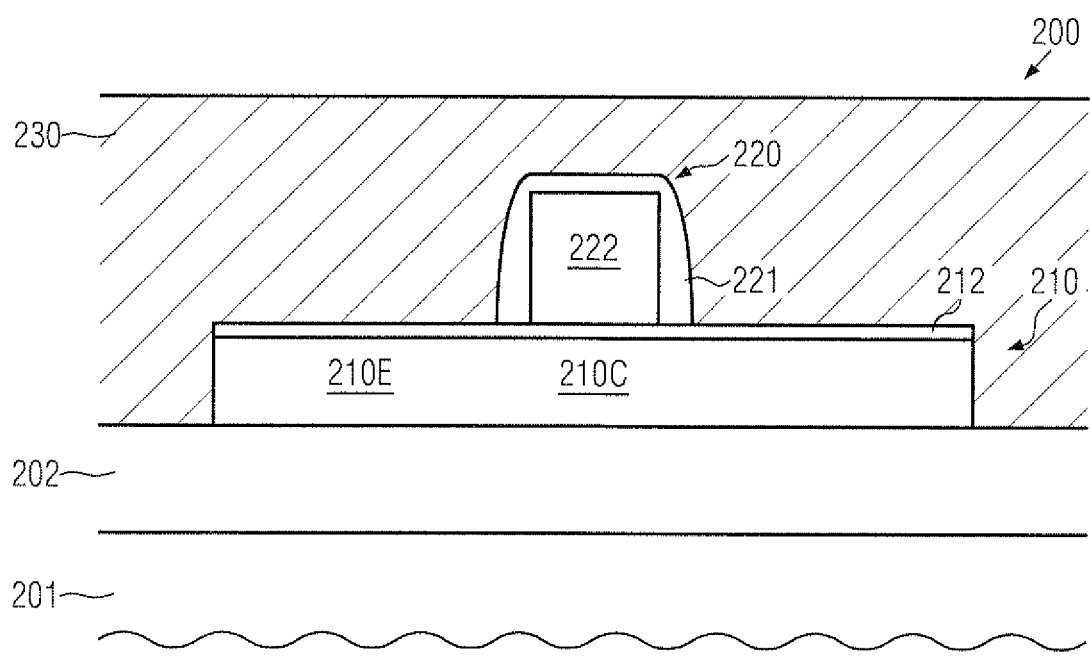
FIG. 2e schematically illustrates a cross-sectional view of the device of FIG. 2d.
Figure 2H:
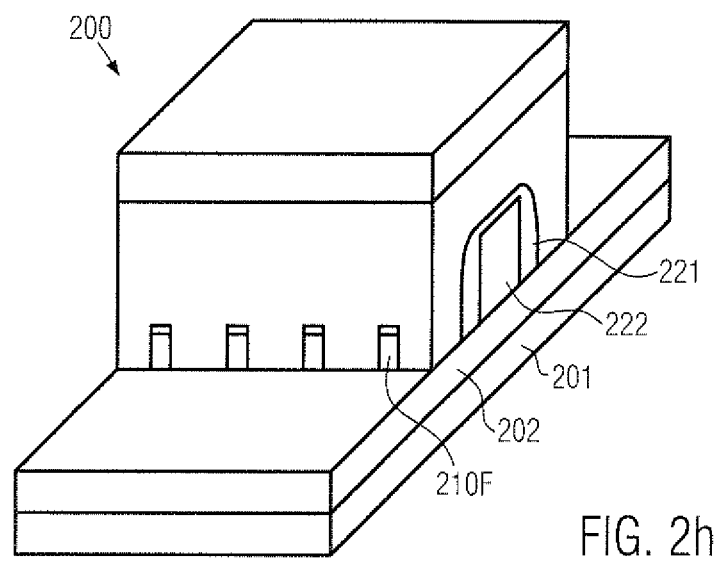
FIGS. 2h-2i schematically illustrate perspective views of the semiconductor device in further advanced manufacturing stages, according to illustrative embodiments.
Figure 2I:
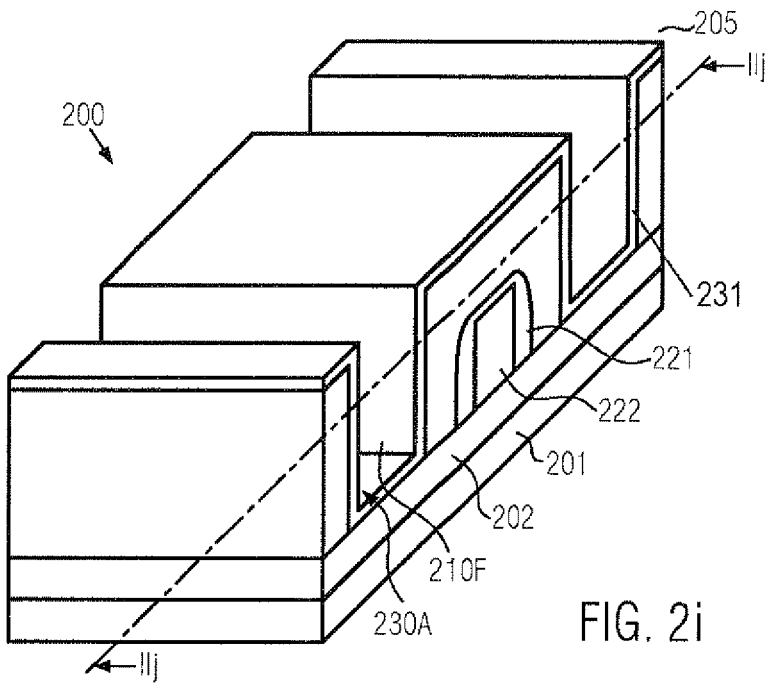
Figure 2J:
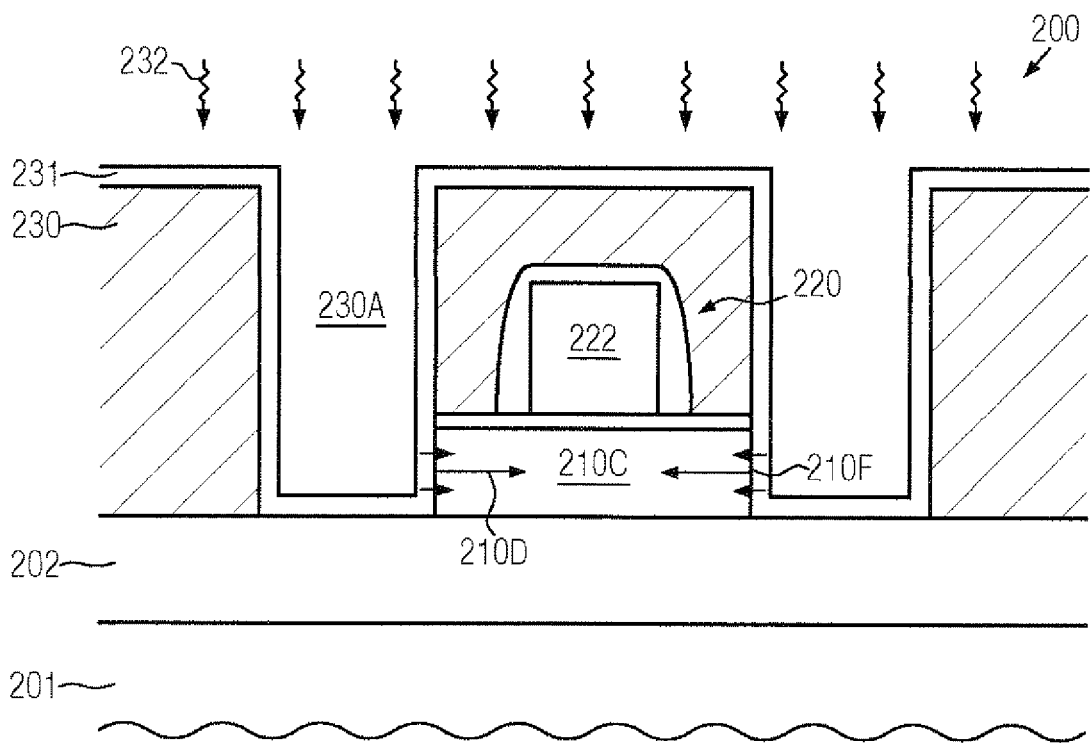
FIG. 2j schematically illustrates a cross-sectional view of the device of FIG. 2i.
Figure 2K:
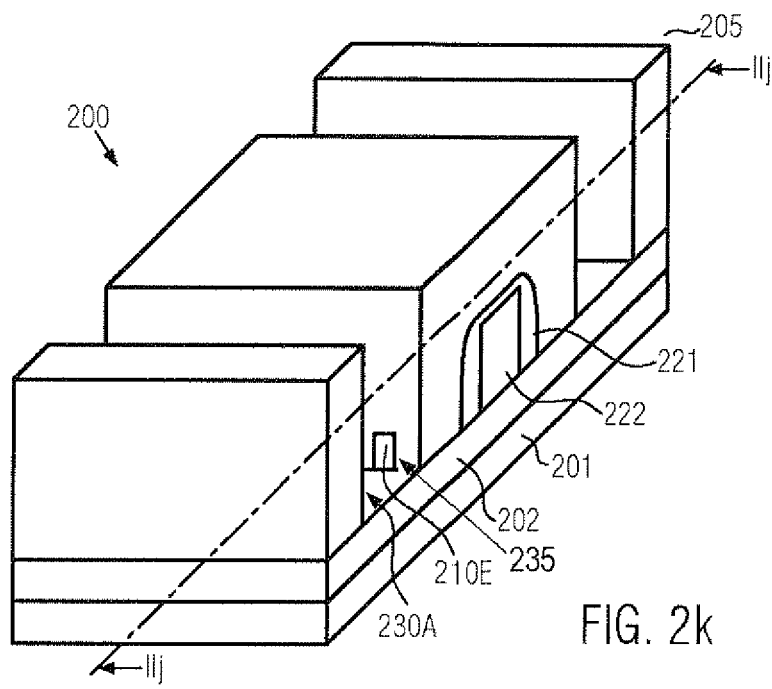
FIGS. 2k-2l schematically illustrate a perspective view and a cross-sectional view, respectively, of the device in a further advanced manufacturing stage.
Figure 2L:
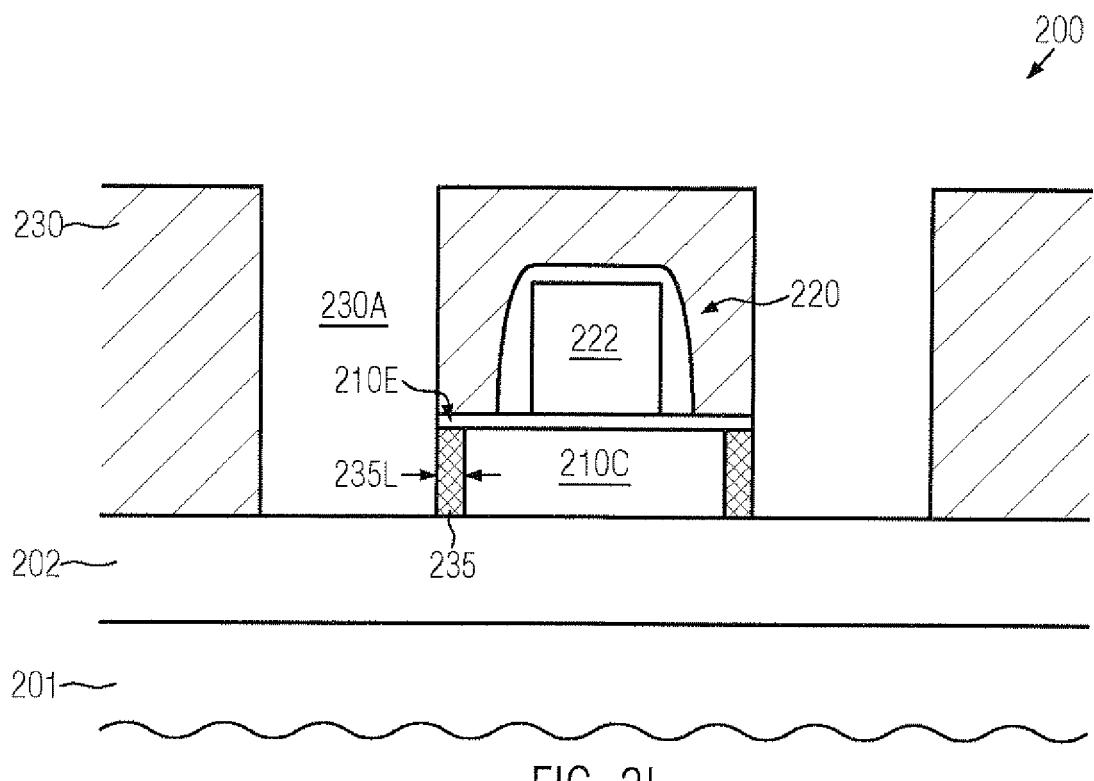
Figure 2M:
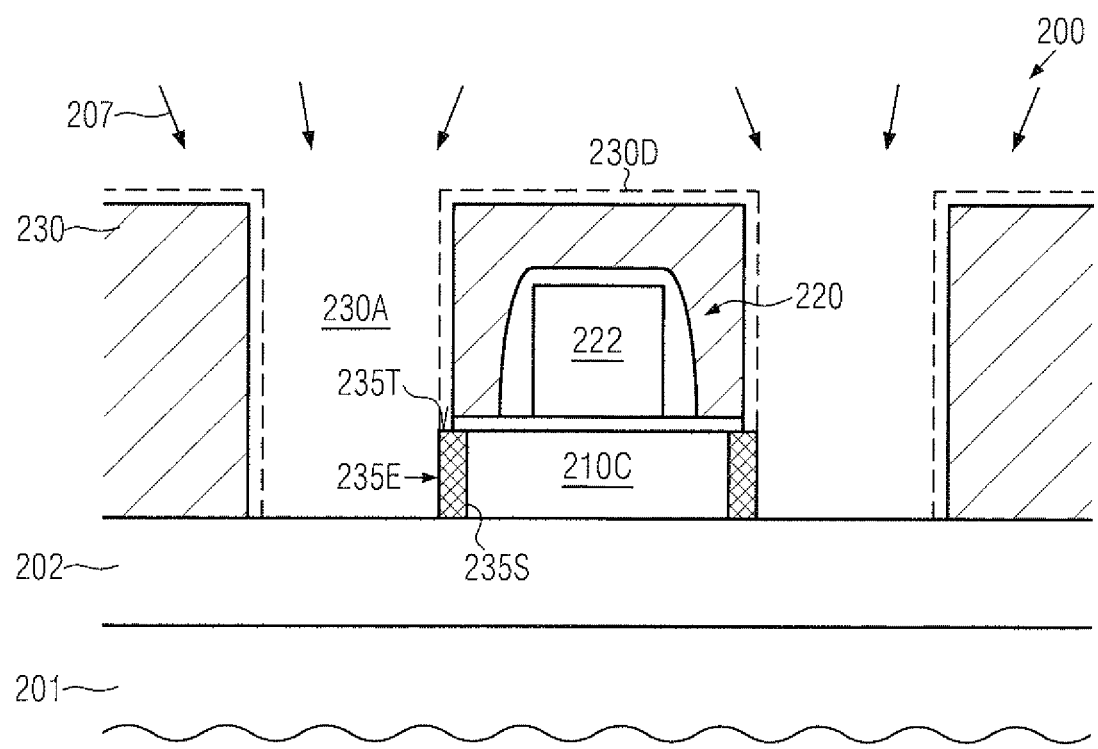
FIG. 2m schematically illustrates a cross-sectional view according to a further illustrative embodiment in which an increased portion of a contact region of respective Fins may be exposed.
Figure 2N:
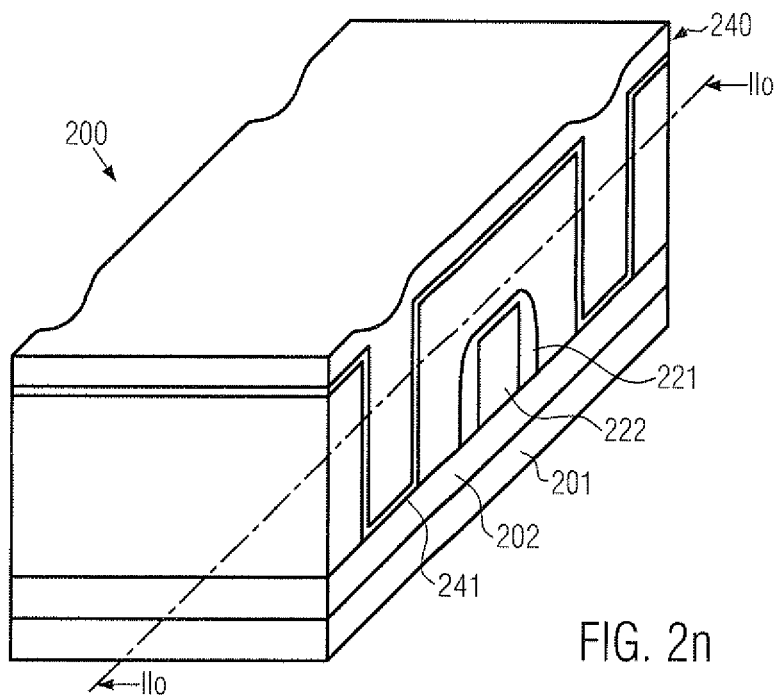
FIGS. 2n-2o schematically illustrate a perspective view and a cross-sectional view, respectively, in a further advanced manufacturing stage, according to illustrative embodiments.
Figure 2O:
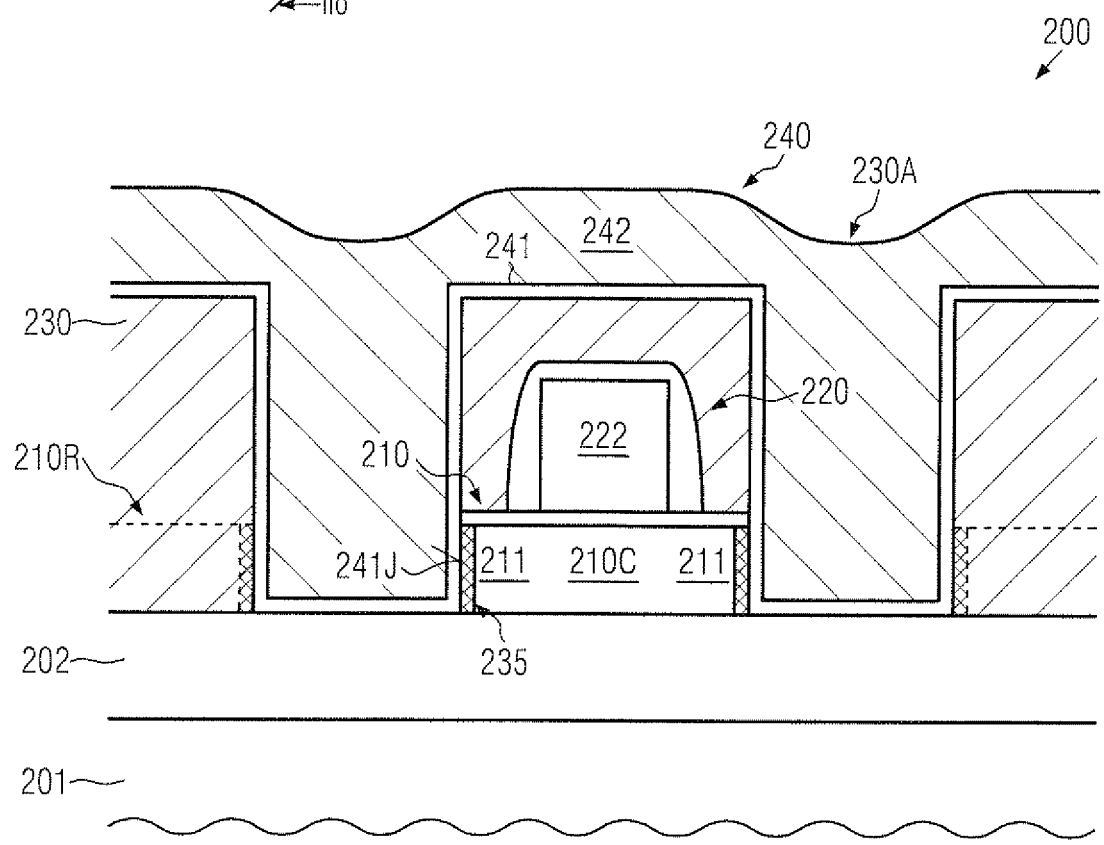
Figure 2P:
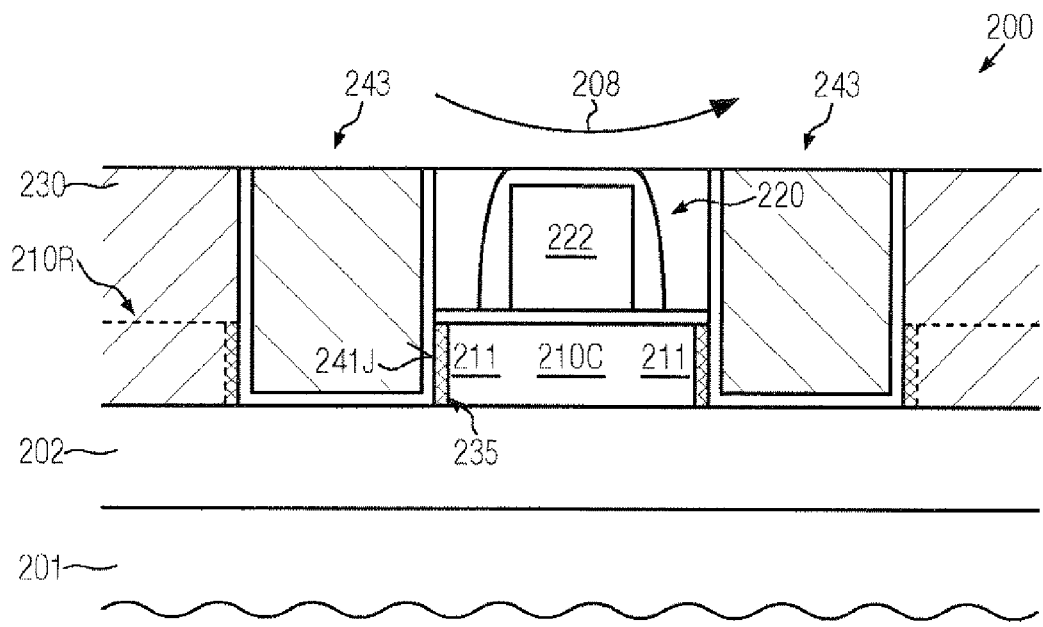
FIGS. 2p-2r schematically illustrate cross-sectional views of the multiple gate transistor elements in various manufacturing stages, according to still further illustrative embodiments.
Figure 2Q:
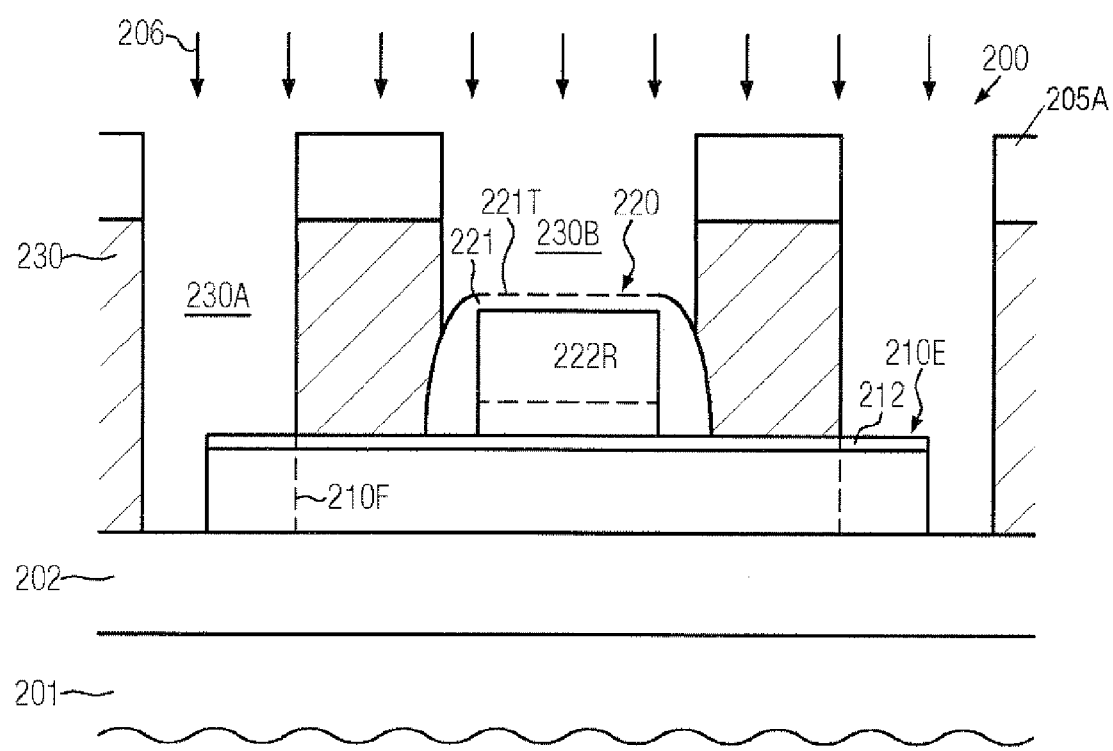
Figure 2R:
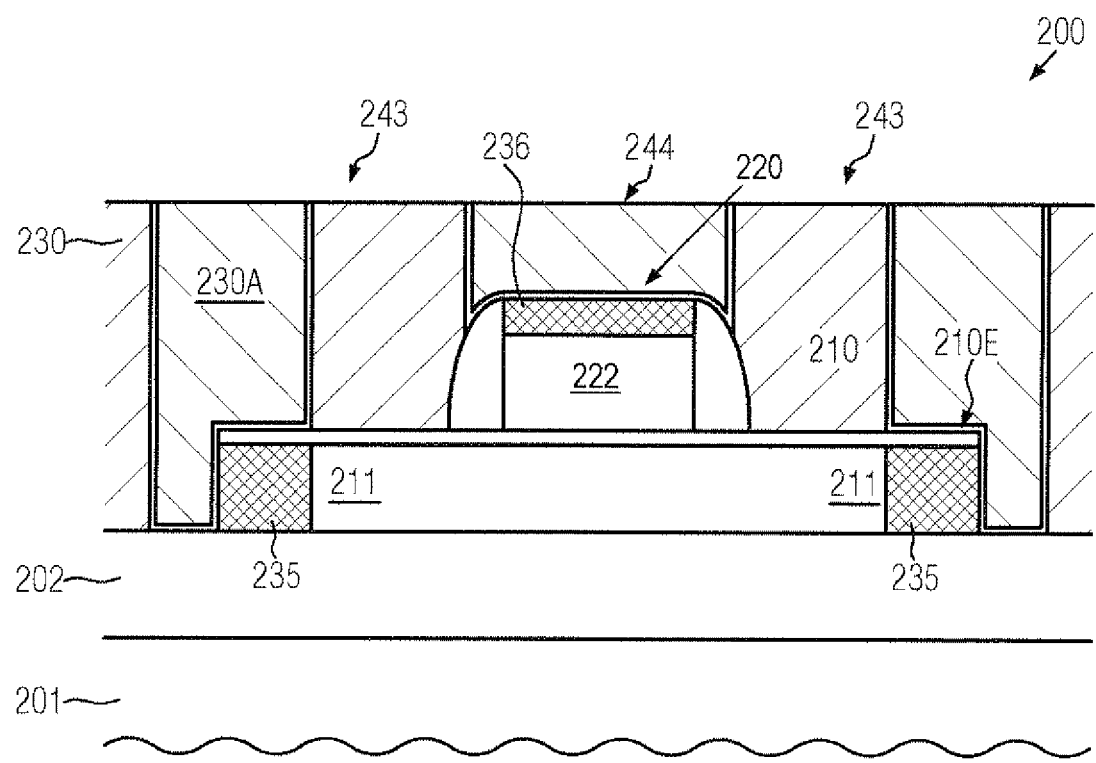

With reference to FIGS. 2a-2r, further illustrative embodiments will now be described in more detail, wherein reference may also be made to FIGS. 1a-1b, if appropriate.

FIG. 2a schematically illustrates a perspective view of a semiconductor device 200, which may also be referred to as multiple gate transistor, since at least two separate channel regions may be controlled by respective portions of a gate electrode, as is also explained above with reference to the semiconductor device 100. In the manufacturing stage shown, the device 200 may comprise a substrate 201, such as a silicon substrate or any other appropriate carrier material, on which may be formed an appropriate base layer 202, which, in some illustrative embodiments, may represent an insulating layer, such as a silicon dioxide layer, a silicon nitride layer, a silicon oxynitride layer and the like. For example, if the substrate 201 may be comprised of a substantially crystalline semiconductor material, the base layer 202, if provided in the form of an insulating material, and the substrate 201 may define an SOI configuration. Moreover, a plurality of Fins 210 are formed on the layer 202 and comprise respective end portions 210E and a central portion 210C, which is covered by a gate electrode structure 220. Furthermore, a gate insulation material may be formed at least on sidewalls of the Fins 210 (not shown in FIG. 2a), while a corresponding gate insulation layer may be formed on a top surface of the Fins 210 if a tri-gate transistor architecture is considered. In other cases, the Fins 210 may be covered by a cap layer (not shown) which may result in an insufficient capacitive coupling to the Fins 210, so that the top surface thereof may effectively not act as a channel region. With respect to any material composition of the Fins 210, it is to be appreciated that any appropriate material, such as silicon, silicon/germanium, germanium or any other appropriate semiconductor compounds, may be used, depending on the overall device requirements. Similarly, the corresponding dimensions of the Fins 210 may be selected in accordance with the design rules of the corresponding technology node under consideration.

FIG. 2b schematically illustrates a cross-sectional view taken along the section IIb of FIG. 2a. As illustrated, a cap layer 212, such as a silicon nitride layer and the like, may be formed on the Fins 210, and the gate electrode structure 220, which may be comprised of any appropriate material, such as polysilicon, a metal-containing material and the like, may be formed on the cap layer 212 and may also extend down to the layer 202 along the corresponding sidewalls of a Fin 210 (not shown in the section of FIG. 2b). The semiconductor device 200 as shown in FIGS. 2a and 2b may be formed on the basis of well-established process techniques as are, for instance, also explained above with reference to the device 100.

FIG. 2c schematically illustrates a perspective view of the transistor 200 in a further advanced manufacturing stage. As illustrated, the gate electrode structure 220 may comprise a sidewall spacer structure 221, which may be comprised of any appropriate material such as silicon nitride, silicon dioxide and the like. The spacer structure may be formed on the basis of well-established deposition and etch techniques, wherein a width of the spacer structure 220 may be selected in accordance with a desired dopant profile in each of the end portions 210E of the Fins 210. That is, moderately high dopant concentration may be established in the end portions 210E adjacent to the gate electrode structure 220, possibly by using an offset spacer element (not shown) and thereafter one or more spacer elements of the structure 221 may be provided and may be used as an implantation mask during one or more subsequent implantation steps to provide the desired high dopant concentration in the end portions 210E with a lateral distance to a gate electrode material 222 of the gate electrode structure 220. It should be appreciated that any appropriate concentration profile extending from the electrode material 222 may be established by appropriately forming a corresponding number of spacer elements in the structure 221. It should further be appreciated that any other implantation processes may be performed, for instance with respect to defining a counter doped area in the vicinity of the central portion 210C, which represents the actual channel region. Drain and source regions 211 may be formed at oppositely positioned end portions 210E having the desired dopant concentration and concentration gradient with respect to the central portion 210C.

FIG. 2d schematically illustrates the semiconductor device 200 in a further advanced manufacturing stage. As illustrated, a dielectric material 230, such as silicon dioxide, silicon nitride, silicon carbide and the like, may be formed above the Fins 210 and the gate electrode structure 220. The dielectric material 230 may, in some illustrative embodiments, be comprised of two or more material layers in order to adapt the material characteristics to the further processing of the device 200. For instance, an etch stop liner may be formed and thereafter the actual fill material may be deposited having the desired material characteristics. In other illustrative embodiments, appropriate anti-reflective coating (ARC) materials, hard mask materials and the like may be provided, at least in an upper portion of the dielectric material 230. The deposition of the material 230 may be accomplished on the basis of well-established deposition techniques, such as plasma enhanced chemical vapor deposition (CVD), thermally activated CVD, spin-on techniques, depending on the material characteristics required. For example, materials of reduced relative permittivity may be selected if an increased fringing capacitance or any other parasitic capacitance with respect to additional wiring levels to be formed above the device 200 are considered inappropriate.

FIG. 2e schematically illustrates a cross-sectional view of the device 200 of FIG. 2d. As illustrated, the material 230 may enclose the gate electrode structure 220 and the end portions 210E of the Fins 210. After the deposition of the dielectric material 230, a lithography process may be performed to provide an etch mask that defines the lateral position and size of corresponding openings to be formed in the dielectric material 230.

FIG. 2f schematically illustrates a perspective view of the device 200 in which an etch mask 205 is formed above the material 230.

FIG. 2g schematically illustrates a cross-sectional view of the device in this manufacturing stage. As illustrated, the device 200 may be exposed to an etch ambient 206 that is designed to anisotropically etch through the dielectric material 230 and, in the embodiment shown, also to etch through the end portions 210E of the Fins 210. That is, in one illustrative embodiment, the etch process 206 may be performed on the basis of an etch chemistry and corresponding etch parameters which may result in an anisotropic etch behavior for the material of the layer 230 and the material of the Fins 210. For example, a plurality of plasma enhanced etch recipes are available for etching through silicon dioxide material and silicon material without a pronounced selectivity, wherein the material of the cap layer 212 may also be efficiently removed. In other cases, an appropriate intermediate etch step may be performed upon exposing the cap layer 212, when provided in the form of a material that may have a significantly lower etch rate compared to the material 230. In other illustrative embodiments, the etch process 206 may be performed on the basis of well-established selective etch recipes thereby efficiently removing material of the layer 230, wherein the Fins 210 may be maintained, depending on the degree of selectivity. Thereafter, the etch chemistry may be appropriately modified so as to effectively etch through the end portions 210E. As previously explained, if a pronounced material removal of the layer 202 at the bottom of an opening 230A formed during the etch process 206 may be considered inappropriate, a corresponding etch stop liner may be formed as a first material layer of the layer 230. Consequently, a cross-sectional area or end face 210F of the end portions 210E may be exposed within the openings 230A, which may therefore be available for forming a homogeneous contact region in the end portions 210E.

FIG. 2h schematically illustrates a perspective view of the semiconductor device 200 after the removal of the etch mask 205, which may, for instance, include any cleaning process for preparing exposed surface portions, such as the end faces or cross-sectional areas 210F for forming thereon an appropriate contact region. In one illustrative embodiment, the end faces 210F may be prepared for forming therein a metal silicide when the Fins 210 may comprise a significant amount of silicon that may enable the generation of a metal silicide material, such as a nickel silicide, a nickel/platinum silicide, a cobalt silicide and the like. For this purpose, well-established wet chemical cleaning and surface preparation processes may be used, while other device areas may be protected by the dielectric material 230.

FIG. 2i schematically illustrates the semiconductor device 200 in a further advanced manufacturing stage in which an appropriate metal, such as nickel, platinum, cobalt, titanium or any combination thereof may be deposited so as to cover at least sidewalls of the opening 230A, as indicated by the layer 231.

FIG. 2j schematically illustrates the device 200 in a cross-sectional view in a further advanced manufacturing stage. As illustrated, in the embodiment shown, the device 200 may be exposed to a heat treatment 232, which is designed to initiate a chemical reaction between material of the layer 231 and the end faces 210F, which are covered by the layer 231 within the openings 230A. The heat treatment 232 may be performed in accordance with well-established silicidation procedures when a metal silicide is to be formed in and on the end faces 210F. Thus, during the heat treatment 232, a substantially uniform diffusion may take place across the entire area of the end faces 210F, thereby also providing a substantially homogeneous distribution of a metal silicide material that is formed during the treatment 232. It should be appreciated that a lateral distance 210D of the end faces 210F with respect to the central region 210C, which may also be considered as the channel region, may be adjusted on the basis of the width of the opening 230A or in general on the basis of the distance of the opening 230A with respect to the central portion 210C. Thus, the final distance of a metal silicide material formed in and on the end faces 210F may be determined by the lateral position of the end faces 210F and also by the corresponding process parameters, i.e., the parameters of the heat treatment 232 in combination with the diffusion characteristics of the material of the layer 231. Since corresponding parameters are well known in the art for a plurality of silicidation processes and materials, a corresponding contact resistance between the end portions and the central region 210C may be efficiently adjusted, while additionally a corresponding homogeneity across the entire area of the end faces 210F may be achieved so that substantially similar conditions with respect to contact resistivity may be obtained along the entire vertical extension of the central region or channel region 210C.

After the heat treatment 232, the further processing may be continued, for instance, by a selective etch process in order to remove any non-reacted material of the layer 231, for which well-established wet chemical etch chemistries are available. Thereafter, if required, any further treatments, such as heat treatments, may be performed to provide the desired material characteristics of a corresponding metal silicide material and/or to enhance the thermal stability thereof.

FIG. 2k schematically illustrates a perspective view of the semiconductor device 200 after the above-described process sequence. Hence, the end portions 210E may have formed thereon and therein a contact region 235, which may be comprised of an appropriate metal silicide material.

FIG. 2l schematically illustrates a cross-sectional view of the device of FIG. 2k, wherein the contact regions 235 may extend along the end portions 210E according to a length 235L, which may be determined by the process parameters and the material characteristics of the metal used, as is also explained above. It should be appreciated that, depending on the characteristics of the previous silicidation reaction, the contact regions 235 may also extend into the openings 230A (not shown). Consequently, the contact regions 235 may provide a surface area that is available for connecting to a contact metal to be formed in the openings 230A, thereby providing enhanced homogeneity of the contact resistivity with respect to the channel region 210C of each of the Fins 210, while also enabling an efficient electrical shorting of each of the Fins 210.

FIG. 2m schematically illustrates the semiconductor device 200 according to one further illustrative embodiment in which the device 200 may be exposed to a further etch ambient 207 that is designed such that an isotropic etch behavior with respect to material of the layer 230 may be obtained. For example, diluted hydrofluoric acid or any other wet chemical or plasma assisted isotropic etch ambient may be established during the process 207 to selectively remove material of the layer 230 with respect to the contact regions 235. Thus, as illustrated by the dashed line 230D, the corresponding material removal may expose additional surface areas of the contact region 235 in addition to a front surface 235E. For example, the top surface 235T may be partially exposed and also corresponding sidewall surfaces 235S may be exposed so that, in this case, an even further enhanced overall surface area may be available for connecting to a contact element still to be formed in the opening 230A. Thus, based on the manufacturing stage shown in FIG. 2l or the manufacturing stage shown in FIG. 2m, the further processing may be continued by filling the openings 230A with a metal-containing material in order to form a corresponding contact element.

FIG. 2n schematically illustrates a perspective view of the semiconductor device 200 with a metal-containing material 240 formed above the device 200 thereby providing an electrical contact to the corresponding contact regions 235 (see FIGS. 2l and 2m).

FIG. 2o schematically illustrates a cross-sectional view of the device 200 of FIG. 2n. In the embodiment shown, the metal-containing material 240 may be comprised of a conductive barrier material 241 and a metal 242 of superior conductivity. For example, in some illustrative embodiments, the conductive barrier material 241 may be provided in the form of well-established barrier materials, such as titanium, titanium nitride and the like, in combination with tungsten as the material 242. In other illustrative embodiments, the highly conductive material 242 may be provided in the form of copper, a copper alloy, aluminum and the like, depending on the overall requirements with respect to conductivity and compatibility with the further processing of the device 200. For example, the conductive barrier material 241 may provide the required diffusion blocking effect in view of sensitive metals, such as copper, thereby substantially suppressing an undue diffusion of copper atoms into sensitive device areas, such as the Fins 210. In this case, a copper material or copper alloy may be provided by well-established electrochemical deposition processes wherein, if required, a seed material may be formed on the conductive barrier material 241, for instance in the form of copper and the like. In other cases, the material 242 may be deposited without any seed material directly on the conductive barrier material 241.

It should be appreciated that the conductive barrier material 241 and thus the material 242 may electrically connect to the contact regions 235, for instance at least via the front surface 235E (FIG. 2m), while in other cases the additional surface areas 235T and 235S (FIG. 2m) may also be in direct contact with the material 241, thereby defining a corresponding interface 241J. Consequently, a homogeneous and efficient electrical contact may be established via the contact region 235 to the drain and source areas 211. It should be appreciated that, depending on the lateral position of the opening 230A and the width thereof, the end portions 210E may have been "intersected" by the opening 230A, thereby also leaving a residual fin portion 210R, which may also connect to the conductive barrier material 241 since a corresponding contact region may have been formed in the residual end portion 210R during the preceding steps. It should be noted that these residual end portions 210R may not negatively affect the overall performance of the device 200 so that a high degree of flexibility in dimensioning and positioning the openings 230A may be provided, irrespective of the initial length of the Fins 210.

FIG. 2p schematically illustrates the semiconductor device 200 in a further advanced manufacturing stage in which the device 200 may be exposed to a removal process 208 in which excess material of the layers 240, 241 (FIG. 2o) may be removed, possibly in combination with material of the layer 230, in order to enable the adjustment of the overall height level of the device 200. The removal process 208 may comprise a chemical mechanical polishing (CMP) process and the like in which corresponding contact elements 243 may be obtained as electrically isolated metal regions that connect to each of the Fins 210 via the interface 241J. As previously explained, the interface 241J may also be formed at the top surface and respective sidewall surfaces, such as the surfaces 235T, 235S (FIG. 2m) if a corresponding increased exposure of the contact regions 235 is required. Moreover, in some illustrative embodiments, the removal process 208 may be continued so as to expose the gate electrode material 222, which may thus be available for connecting to a further metallization layer to be formed above the device 200 in accordance with the overall device requirements. Thus, any appropriate contact regime for the gate electrode structure 220 may be used in this manufacturing stage.

With reference to FIGS. 2q-2r, further illustrative embodiments will now be described in which the contact elements 243 and a corresponding contact element for the gate electrode structure 220 may be formed in a common manufacturing sequence.

FIG. 2q schematically illustrates a cross-sectional view of the device 200 in a manufacturing stage that is similar to the manufacturing stage as previously discussed with reference to FIG. 2g. As illustrated, the device 200 may have formed thereon an etch mask 205A used during the etch process 206, wherein the etch mask 205A may also define an opening 230B in the material 230 that exposes at least a portion of the gate electrode structure 220. For instance, the etch process 206 may be performed on the basis of a selective anisotropic etch recipe, in which material of the layer 230 may be selectively removed with respect to material of the gate electrode structure 220 and the Fins 210. For example, silicon dioxide may be selectively removed with respect to silicon material, while in other cases the etch process 206 may be controlled on the basis of the cap layer 212 and the spacer structure 221 so as to avoid significant material removal of the gate electrode material 222 and of the Fins 210. In still other illustrative embodiments, the etch process 206 may be controlled on the basis of the spacer structure 221, which may comprise a moderately thick top layer 221T, thereby avoiding significant material removal of the gate electrode 222, while enabling to etch through the end portions of the Fins 210, as is also previously described. A corresponding etch behavior is schematically illustrated by the dashed lines 210F. Thereafter, the residue of the cap layer 221T may be removed in a final phase of the etch process 206, thereby exposing the gate electrode 222. In still other illustrative embodiments, the etch process 206 may be performed so as to etch through the end portions 210E, as indicated by the dashed line 210F, while also etching into the gate electrode material 222, thereby forming a corresponding recess, as indicated by the dashed line 222R. Consequently, after the etch process 206, surface areas of the end portions 210E are available for being contacted by an appropriate metal while also at least a portion of the gate electrode material 222 is available for forming therein and thereon a contact element. For example, after removing the etch mask 205A, the exposed surface portions may be prepared for a silicidation process, as is also previously described. In other cases, the corresponding openings 230A, 230B may directly be filled with a conductive barrier material and a highly conductive metal if the available surface areas for connecting to the Fins 210 and to the gate electrode material 222 are considered appropriate.

FIG. 2r schematically illustrates the semiconductor device 200 in a further advanced manufacturing stage. As illustrated, the contact elements 243 may be formed in the openings 230A and may be comprised of any appropriate material, as is also discussed above. Furthermore, in the embodiment shown, respective contact regions 235 may be formed in the end portions 210E if deemed appropriate. In other cases (not shown), the contact regions 235 may not be provided. It should further be appreciated that the end portions 210E may extend "into" the contact elements 243, depending whether or not the part of the end portions 210E has been removed or etched through during the preceding etch process 206 (FIG. 2q). Moreover, the device 200 may comprise a further contact element 244 connecting to the gate electrode material 222 wherein, depending on the desired process strategy, a corresponding contact region 236, for instance comprised of a metal silicide, may be provided in the material 222. The device 200 as illustrated in FIG. 2r may be formed on the basis of similar process techniques as previously described with reference to FIGS. 2n-2p, wherein, however, in this case, the contact elements 244, possibly in combination with the contact region 236, may also be obtained. Hence, the gate electrode structure 220 may be contacted without any additional processes compared to the sequence described above, wherein also a homogenous electrical connection between the contact elements 243 and the corresponding drain and source areas 211 may be achieved. Thus, a further metallization level may be formed by depositing an appropriate dielectric material and forming therein metal lines or metal regions connecting to the contact elements 243, 244, as required by the overall circuit layout.

As a result, the present disclosure provides multiple gate transistors and respective manufacturing techniques in which enhanced uniformity of contact resistivity for each of the plurality of drain and source regions of corresponding Fins may be accomplished while nevertheless maintaining a high degree of compatibility to well-established contact process techniques. For example, well-established silicidation procedures may be applied to an exposed end face of the corresponding Fins, thereby providing a high degree of homogeneity of the corresponding silicide region, while at the same time enabling an efficient electrical short of the Fin end portions via the metal silicide regions by forming a common contact element. In other embodiments, contact elements with enhanced uniformity may be formed for the drain and source regions of the multiple gate transistor while simultaneously providing a contact element to the gate electrode structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a gate electrode structure of a multiple gate transistor above a plurality of fins, wherein said gate electrode structure comprises a gate electrode material, and wherein end portions of each of said plurality of fins extend laterally from said gate electrode structure;
    forming a dielectric material above said gate electrode structure and above at least said end portions of said plurality of fins;
    forming an opening in said dielectric material so as to extend through and expose a cross-sectional area of each of said end portions;
    after forming said opening, forming a contact region in said exposed cross-sectional area of each of said end portions exposed in said opening;
    forming a contact element in said opening, said contact element connecting to each of said contact regions; and
    prior to forming said contact regions, removing a portion of said dielectric material so as to expose a portion of said gate electrode material.

2. The method of claim 1, wherein forming said contact region in said exposed cross-sectional area of each of said end portions comprises depositing a metal and initiating a chemical reaction of said metal with material of each of said exposed cross-sectional areas.

3. The method of claim 2, wherein said chemical reaction produces a metal silicide.

4. The method of claim 1, further comprising forming at least one of drain and source regions in said end portions prior to forming said opening.

5. The method of claim 1, wherein forming said dielectric material above said end portions comprises depositing a dielectric material layer and planarizing said dielectric material layer.

6. The method of claim 1, further comprising removing material of said dielectric material after forming said contact regions so as to expose at least one of a top surface and a sidewall surface of each of said contact regions.

7. The method of claim 6, wherein said at least one of said top surface and said sidewall surface of each of the contact regions is exposed by performing a wet chemical etch process.

8. The method of claim 1, further comprising forming a gate contact region and said contact regions of the end portions in a common manufacturing process.

9. A method of forming a contact element connecting to a multiple gate transistor, the method comprising:
    forming a dielectric material so as to enclose an end portion of one or more fins of said multiple gate transistor, said one or more fins being formed above a material layer of a device substrate, wherein said dielectric material is further formed above a gate electrode structure of said multiple gate transistor, said gate electrode structure being formed above said one or more fins;

removing a portion of said dielectric material so as to expose a portion of a gate electrode material of said gate electrode structure;

forming a contact opening in said dielectric material, said contact opening exposing at least a portion of said one or more fins and a surface of said material layer;

after exposing said portion of said gate electrode material of said gate electrode structure, forming a contact region on said at least said portion of said one or more fins exposed by said contact opening; and filling said contact opening with a metal-containing material so as to provide a contact element that connects to said contact region on said at least said portion of said one or more fins.

10. The method of claim 9, wherein said contact opening is formed so as to extend through said end portion and to expose a cross-sectional area thereof.

11. The method of claim 10, wherein said contact region is formed on said exposed cross-sectional area.

12. The method of claim 11, wherein said contact region is formed during a silicidation process.

13. The method of claim 12, further comprising exposing an increased portion of said contact region by performing an isotropic etch process.

14. The method of claim 9, wherein said end portion of said one or more fins comprises sidewall surfaces, and wherein forming said contact opening comprises exposing at least a portion of said sidewall surfaces.

15. The method of claim 9, wherein exposing said gate electrode material of said gate electrode structure comprises removing material of said dielectric material.

16. The method of claim 1, wherein each of said plurality of fins is formed above an insulating material layer formed on a semiconductor substrate, and wherein forming said opening so as to extend through each of said end portions comprises exposing a surface of said insulating material layer.

17. A method, comprising:

forming a fin above a material layer of a device substrate;

forming a gate electrode structure above said fin, wherein said gate electrode structure comprises a gate electrode material;

forming a dielectric material layer above said gate electrode structure and above an end portion of said fin;

removing a portion of said dielectric material layer so as to expose a portion of said gate electrode material;

forming a contact opening through said dielectric material and through said end portion, said contact opening exposing a cross-sectional area of said fin and a surface of said material layer;

after exposing said portion of said gate electrode material, forming a metal silicide contact region in at least said cross-sectional area of said fin exposed by said contact opening; and filling said contact opening with a conductive material to form a contact element therein, said contact element connecting to said metal silicide contact region in at least said exposed cross-sectional area of said fin.

18. The method of claim 17, wherein filling said contact opening with said conductive material comprises forming a conductive barrier layer in said contact opening and forming a metal-containing material layer above said conductive barrier layer.

19. The method of claim 17, wherein removing said portion of said dielectric material layer comprises performing a chemical mechanical polishing process.

20. The method of claim 17, wherein removing said portion of said dielectric layer comprises forming at least a portion of a second contact opening through said dielectric material layer during a common etching process that is used to form said contact opening.

* * * * *